United States Patent
Kons et al.

(10) Patent No.: US 7,958,424 B2
(45) Date of Patent: Jun. 7, 2011

(54) MULTI-CHANNEL LDPC DECODER ARCHITECTURE

(75) Inventors: Shachar Kons, Haifa (IL); Gadi Kalit, Nahariya (IL); Eran Arad, Misgav (IL); Shimon Gur, Haifa (IL); Yoav GoldenBerg, Kiryat Bialik (IL); Abraham Krieger, San Diego, CA (US)

(73) Assignee: Trident Microsystems (Far East) Ltd., Grand Cayman (KY)

( * ) Notice: Subject to any disclaimer, the term of this patent is extended or adjusted under 35 U.S.C. 154(b) by 814 days.

(21) Appl. No.: 11/303,876

(22) Filed: Dec. 16, 2005

(65) Prior Publication Data

US 2007/0011564 A1 Jan. 11, 2007

Related U.S. Application Data

(60) Provisional application No. 60/717,535, filed on Sep. 14, 2005, provisional application No. 60/693,210, filed on Jun. 22, 2005.

(51) Int. Cl.
*H03M 13/00* (2006.01)
(52) U.S. Cl. .................................. 714/752; 714/758
(58) Field of Classification Search ............ 714/752, 714/758
See application file for complete search history.

(56) References Cited

U.S. PATENT DOCUMENTS

| | | | |
|---|---|---|---|
| 6,404,828 B2 | 6/2002 | Kaewell, Jr. | |
| 6,539,367 B1 | 3/2003 | Blanksby et al. | |
| 6,633,856 B2 * | 10/2003 | Richardson et al. | 706/15 |
| 7,127,664 B2 * | 10/2006 | Nicol et al. | 714/792 |
| 7,143,336 B1 | 11/2006 | Moon et al. | |
| 7,179,691 B1 | 2/2007 | Lee et al. | |
| 7,206,364 B2 | 4/2007 | Miller | |
| 7,231,577 B2 | 6/2007 | Richardson et al. | |
| 7,260,764 B2 * | 8/2007 | Chen | 714/774 |
| 7,296,216 B2 | 11/2007 | Shen et al. | |
| 7,340,003 B1 | 3/2008 | Nazari et al. | |
| 7,395,495 B2 | 7/2008 | Jacobsen | |
| 7,414,551 B2 | 8/2008 | Lee et al. | |
| 7,418,051 B2 | 8/2008 | Kramer et al. | |
| 7,434,145 B2 | 10/2008 | Jin et al. | |
| 7,461,328 B2 | 12/2008 | Dabiri et al. | |
| 2004/0194007 A1 * | 9/2004 | Hocevar | 714/801 |
| 2005/0007262 A1 | 1/2005 | Craven et al. | |
| 2005/0229087 A1 * | 10/2005 | Kim et al. | 714/800 |
| 2005/0262420 A1 * | 11/2005 | Park et al. | 714/758 |
| 2006/0015791 A1 * | 1/2006 | Kikuchi et al. | 714/758 |
| 2006/0020868 A1 * | 1/2006 | Richardson et al. | 714/752 |
| 2006/0107176 A1 * | 5/2006 | Song | 714/758 |

OTHER PUBLICATIONS

"A Reduced Complexity Decoder Architecture via Layered Decoding of LDPC Codes," Dale E. Hocevar, DSP Solutions R&FD Center, Texas Instruments, Dallas, TX, SIPS 2004, pp. 107-112.
Jilei, H, Siegel, P and Milstein, L, Design of multi-input munti-output systems based on low-density parity-check codes. IEEE transactions on communications. Apr. 2005, vol. 53, No. 4, pp. 601-611, ISSN 0090-6778. Kschischang, Frank R., et al., "Factor Graphs and the Sum-Product Algorithm", IEEE Transactions on Information Theory, vol. 47, No. 2, pp. 496-519 (2001).

* cited by examiner

*Primary Examiner* — Sam Rizk
(74) *Attorney, Agent, or Firm* — DLA Piper LLP (US)

(57) ABSTRACT

A multi-channel decoder system has a decoder core at least a portion of which is configurable as a LDPC decoder that, during decoding processing, divides check nodes of a node representation of a LDPC code into a plurality of groups, and, during an iteration, sequentially processes the groups while processing in parallel the check nodes within each group, thus improving decoding throughput.

21 Claims, 8 Drawing Sheets

| MODE | DECODER CORE | DEMOD |
|---|---|---|
| 1 | LDPC/BCH | 8-PSK or QPSK | DVB-S2
| 2 | CC/RS | QPSK | DVB-S

MULTI-CHANNEL LDPC DECODER ARCHITECTURE

This application claims the benefit of U.S. Provisional Patent Application No. 60/717,535, filed Sep. 14, 2005; and U.S. Provisional Patent Application No. 60/693,210, filed Jun. 22, 2005, both which are hereby fully incorporated by reference herein as though set forth in full. This application is related to U.S. patent application Ser. No. 11/303,449, entitled "EFFICIENT DECODERS FOR LDPC CODES," filed concurrently herewith, which is also incorporated by reference herein as though set forth in full.

BACKGROUND OF THE INVENTION

1. Field of the Invention

This application relates generally to decoders for Low Density Parity Check (LDPC) codes, and, more specifically, to increasing the throughput of such decoders.

2. Related Art

LDPC decoders are characterized by a parity check matrix, the rows of which define parity check equations for checking whether a candidate LDPC code word is valid or not. In particular, the bits in a row of the matrix define the bits in a candidate code word that, when XORed together, must produce a zero result for a code word to be valid. When a code word satisfies, i.e., resolves to zero, all the parity check equations implied by a parity check matrix, the code word is deemed to be valid.

Current LDPC decoders, employing a check node/bit node structure that tracks the parity check equations of the parity check matrix, iterate until a predetermined exit condition is satisfied, for example, the condition when all of the parity check equations are resolved to zero, or the condition when a fixed number of iterations have been performed. Each iteration proceeds in two steps. In the first step, each of the check nodes is processed by computing the XOR of hard decision, full bit estimates for all connected bit nodes, and then generating update messages for each of these bit nodes responsive to soft decision, extrinsic bit estimates. In the second step, the hard decision, full bit estimates for the bits nodes are updated in response to the update messages. Significantly, the second step does not begin until all the check nodes have completed the first step. That in turn increases the time for the decoder to converge.

Although efforts have been made to overlap check node and bit node processing within an iteration, see US 2004/0194007, Hocevar, "Layered Low Density Parity Check Decoding For Digital Communications," filed Mar. 23, 2004, and "A Reduced Complexity Decoder Architecture Via Layered Decoding Of LDPC Codes," Dale E. Hocevar, IEEE SIPS 2004, pp. 107-112, and therefore increase decoder throughput, these efforts have been limited to specific LDPC codes, for example, those in which all of the columns of the parity check matrix for a group have a weight of one or less, implying that none of the check nodes within the group share the same bit node. Since LDPC codes in general violate this constraint, these efforts have not been significant.

SUMMARY

The invention provides a multi-channel decoder system having a decoder core at least a portion of which comprises or is configurable as a LDPC decoder, a plurality of channels for carrying data to and from the decoder core, each channel for carrying data from a decoder input to the decoder core, and, after at least some decoding thereof by the decoder core, for carrying the resulting decoded data from the decoder core to a decoder output. The decoder system also has control logic for controlling application of the decoder core to the data carried by one or more of the channels.

The decoder core may be configurable into a plurality of modes responsive to a mode signal. In one of the modes, the decoder core may form a concatenated decoder having an inner decoder and an outer decoder, with an LDPC decoder forming the inner decoder, and a block decoder, for example, a BCH decoder, forming the outer decoder. In a second one of the modes, the decoder core may form a concatenated decoder having an inner decoder and an outer decoder, with a Convolutional Code decoder, for example, a Viterbi decoder, forming the inner decoder, and a Reed-Solomon decoder forming the outer decoder.

Each of the inputs to the system may also be coupled to a demodulator that is configurable into a plurality of modes responsive to a mode signal. For example, in one mode, the demodulator may be configurable as an 8-PSK demodulator, while, in a second mode, the demodulator may be configurable as a QPSK demodulator.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

FIG. 8(*b*) is a block diagram of a concatenated encoder with an outer block encoder and an inner LDPC encoder.

DETAILED DESCRIPTION

Figure 1:
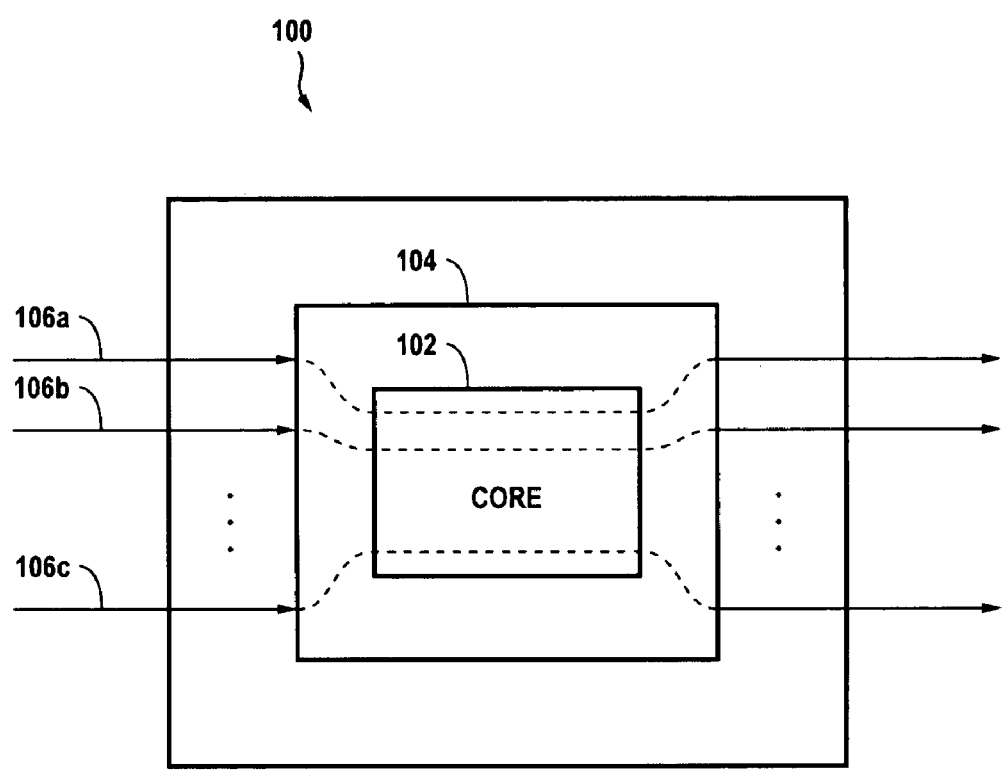
FIG. 1 illustrates the main components of a multi-channel decoder.

Referring to FIG. 1, a multi-channel decoder system 100 comprises a decoder core 102, at least a portion of which comprises or is configurable as a LDPC decoder, and a plurality of independent channels 106*a*, 106*b*, 106*c* for carrying data to and from the decoder core 102, each channel for carrying data from a decoder input to the decoder core 102, and for carrying, after at least some decoding thereof by the decoder core 102, the resultant decoded data from the decoder core 102 to an output of the decoder 100. The decoder 100 further comprises control logic 104 for controlling application of the decoder core 102 to data carried by one or more of the channels.

The decoder core 102 preferably fully decodes the data carried by a channel before being applied to decode the data carried by a different channel, although it should be appreciated that there are certain cases in which the decoding does not converge, so the process of decoding a particular item of data must be terminated before the data has been successfully decoded. Moreover, the decoder core preferably decodes the data carried by different ones of the channels in the order in which the data arrives at the channel, although it should be appreciated that other policies for applying the decoder core 102 are possible, such as round robin. It should further be appreciated that, although the decoder core 102 is capable of decoding data at each of the channels, in practice, there may be periods of time during which the data is present at only some of the channels, and the decoder core 102 is applied only to these channels.

Figure 2:
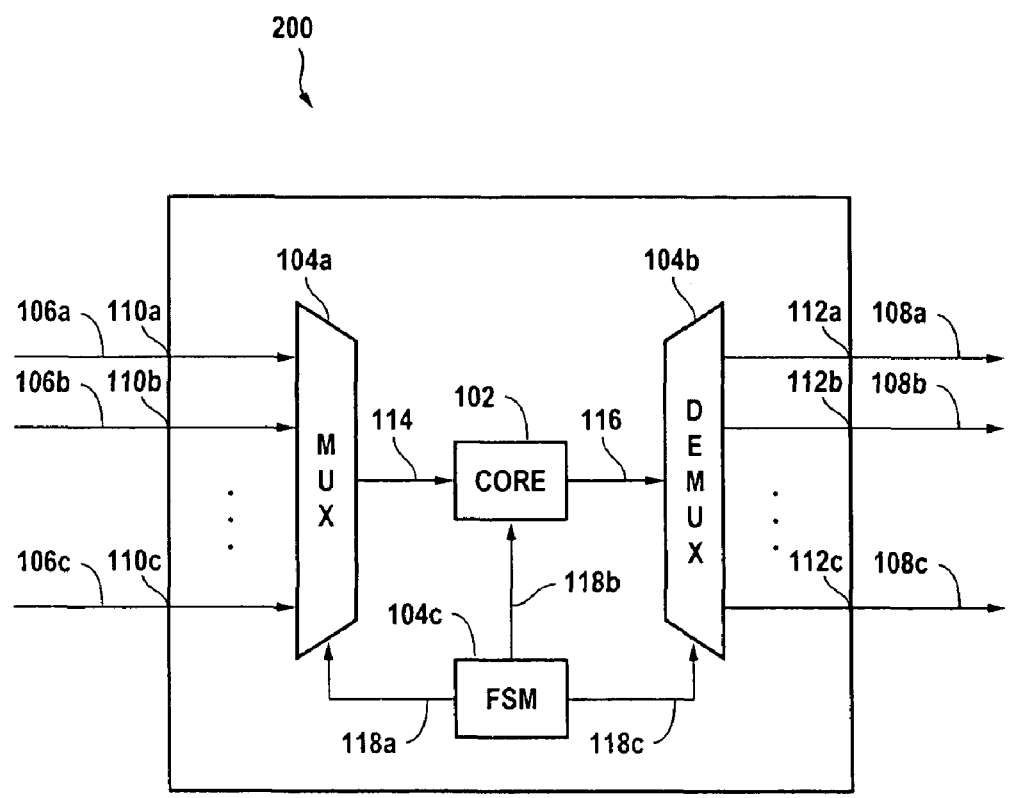
FIG. 2 illustrates an embodiment of the multi-channel decoder of FIG. 1, where the channels are physically realized as a plurality of parallel signal paths.

Each of the channels is a logical channel that typically can be physically realized in many different ways. In one embodiment, illustrated in FIG. 2, the channels are physically realized as a plurality of parallel signal paths 106*a*, 106*b*, 106*c*, each of which originates at or passes through a separate input 110*a*, 110*b*, 110*c* of the decoder system 200, and, after passing through multiplexor 104*a*, converges over segment 114. Then, after passing through the decoder core 102 and over segment 116, the signal paths diverge again within de-multiplexor 104*b* into physically separate paths 108*a*, 108*b*, 108*c*, each of which terminates at or extends through a separate output 112*a*, 112*b*, 112*c* of the decoder system 200. A Finite State Machine (FSM) controls the operation of multiplexor 104*a*, decoder core 102, and demmultiplexor 104*b*, responsive to one or more control signals 118*a*, 118*b*, 118*c*. In one example, the system 200 of FIG. 2 is implemented on a single integrated circuit chip.

However, it should be appreciated that other ways of physically realizing the channels are possible, including, for example, an approach where the data from the different channels is transmitted, either serially or in parallel, and divided in time, frequency or some other parameter, over the same signal path extending from a single decoder system input to a single decoder system output, or an approach is which the channels are physically realized as separate, parallel signal paths on either the input or output side, and a common signal path on the other side.

In one embodiment, at least a portion of the decoder core 102 comprises or is configurable as a hybrid LDPC decoder, a decoder for LDPC codes having the following two properties:

1.) The structure of the LDPC code allows parallel processing of groups of check nodes simultaneously. These check nodes groups can also be referred to as groups of rows in the LDPC code's parity check matrix.

2.) In at least one of the above check nodes groups, there are at least two check nodes that are connected to one bit node. Referring to the parity check matrix of the LDPC code, in at least one of group of rows there is a column with a weight that is greater than one.

Figure 3:
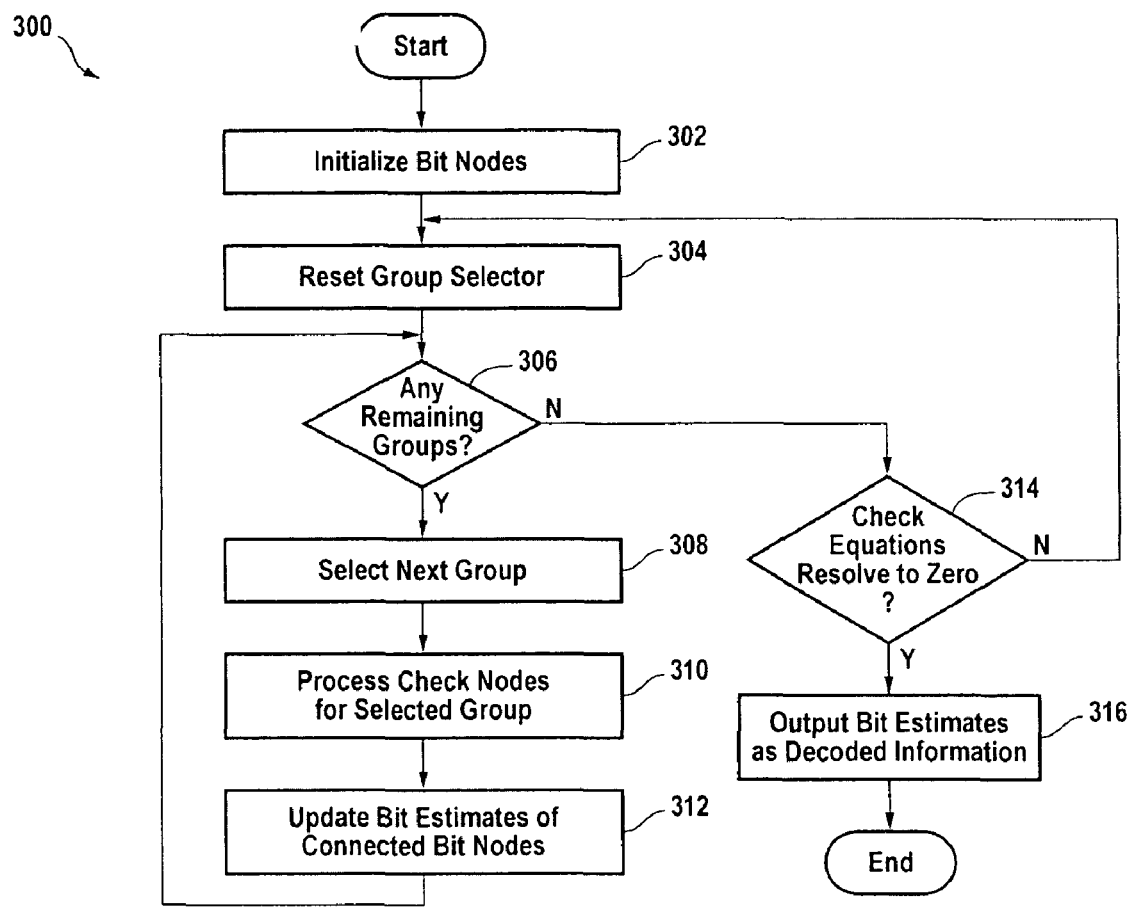
FIG. 3 is a flowchart of a method of operating a hybrid LDPC decoder applicable to codes in which check nodes in a group may be connected to the same bit node, in which the decoder successively processes groups of check nodes in an iteration, and, after processing a group of check nodes in an iteration, updates the connected bit nodes before processing the next group of check nodes.

FIG. 3 depicts a flowchart of the decoding method 300 employed by this hybrid LDPC decoder. The method is iterative and contemplates dividing up the check nodes into groups. Within each iteration, all the groups of check nodes are sequentially processed, with the check nodes in each group processed in parallel. The method continues to iterate until all the check node equations are resolved to zero.

Turning to FIG. 3, the method begins with box 302, initializing the bit nodes with initial estimations. Box 302 is followed by box 304, resetting a group selector, a selector for selecting one of the groups of check nodes to be processed. Box 304 is followed by query diamond 306, which queries whether there are any remaining groups of check nodes to be processed for the current iteration. If so, the method proceeds to box 308. If not, the method proceeds to query diamond 314.

In box 308, the method selects the next group of check nodes to be processed. Box 308 is followed by box 310. In box 310, the check nodes for the currently selected group are processed in parallel. The act of processing a group of check nodes involves:

Sending messages from bit nodes to check nodes, messages that, in one implementation, include information from all connected check nodes, except from the target check node. Such information may be referred to as extrinsic information.

Computing new estimations for the connected bit nodes in every check node and sending these estimations as messages back to the bit nodes.

Box 310 is followed by box 312. In box 312, the bit estimates for the connected bit nodes are updated in response to the check node to bit node messages.

The method then loops back to query diamond 306, and continues to loop until all the groups have been processed. When all check nodes groups have been processed, a decoding iteration is deemed completed, and the method branches to query diamond 314. In query diamond 314, the method determines whether the current bit estimates fully resolve all the parity check equations to zero. If so, a successful decoding operation has occurred, and the method proceeds to box 316. In box 316, the current bit estimates are outputted as the decoded information. Otherwise, the method loops back to the input side of box 304 for another iteration.

The principal difference between this method and the conventional method applicable to LDPC codes in general, including LDPC codes where check nodes in the same group can be connected to the same bit node, is that the bit nodes computations and the check nodes computations within an iteration are not performed in two separate phases. Instead, in the above method, a check node uses messages from bit nodes that were updated from other check node groups in the current iteration. The method differs from the conventional method, where a check node uses messages from bits nodes that were updated in the previous iteration. Consequently, compared to the conventional method, the method processes updates of the bit nodes sooner, which allows for a more rapid convergence, fewer decoding iterations, and greater throughput.

Figure 4A:
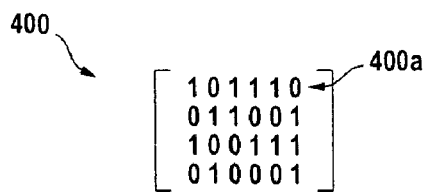
FIG. 4(*a*) is an example of a parity check matrix, and FIG. 4(*b*) illustrates an interconnected assembly of check and bit nodes that correspond to this parity check matrix.
Figure 4B:
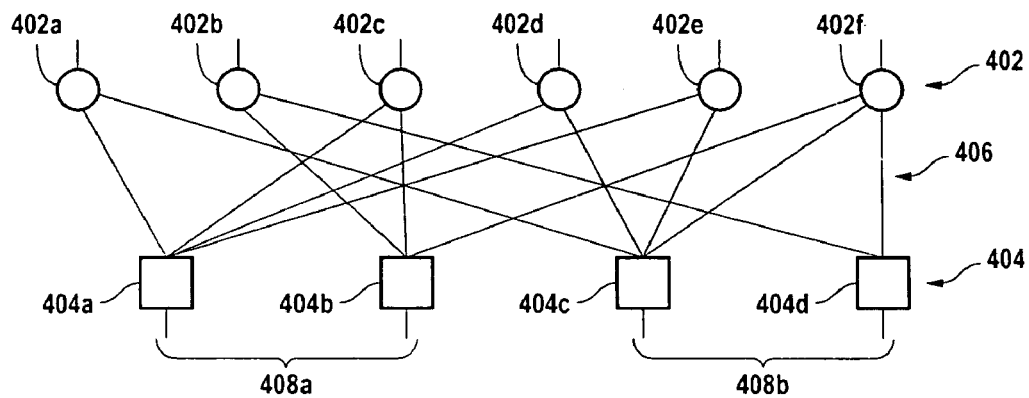

FIGS. 4A-4B illustrate this difference in the context of a specific example. FIG. 4A illustrates a parity check matrix 400 for a particular LDPC code. FIG. 4B illustrates the decoder structure implied by this parity check matrix. Numeral 402 identifies the bit nodes, one for each column of the parity check matrix 400. Each bit node is associated with a corresponding hard decision, total bit estimate (not shown), and one or more soft decision, extrinsic bit estimates (not shown). Numeral 404 identifies the check nodes, one for each row of the parity check matrix 400. Numeral 406 identifies the connections between the bit nodes and the check nodes. Such a connection is present for every logical "1" in the parity check matrix. Consider, for example, check node 404a, corresponding to row 400a of the matrix 400. Connections are present between this check node and each of the bit nodes corresponding to the logical "1"s in row 400a. These bit nodes are identified with numerals 402a, 402c, 402d, and 402e. A similar relationship holds between the connections for each of the remaining check nodes and the remaining rows of the matrix 400.

The check nodes 404 are divided into two groups, identified with numerals 408a and 408b. In a particular iteration, the two groups are processed sequentially, group 408a followed by group 408b. Within a group, the check nodes are processed in parallel. In this particular example, a check node is processed by XORing the hard decision, total bit estimates for all connected bit nodes, and also generating update messages from the soft decision, extrinsic bit estimates from the connected bit nodes.

If the result of XORing the hard bit estimates is zero, indicating the parity check equation corresponding to the check node resolves to zero, the parity check equation is deemed satisfied. Regardless of whether the parity check equation is or is not satisfied by the current bit estimates, then update messages are generated for each of the connected bit nodes responsive to the soft decision, extrinsic bit estimates for these bit nodes, indicating updates for each of the hard decision, total bit estimates corresponding to the connected bit nodes.

Thus, for example, check node 404a is processed by XORing the hard decision, total bit estimates corresponding to bit nodes 402a, 402c, 402d and 402e. Update messages are then generated for each of these bit nodes responsive to the soft decision, extrinsic bit estimates for these bit nodes. In parallel with the foregoing, check node 404b is processed by XORing the hard decision, total bit estimates corresponding to bit nodes 402b, 402c, and 402f. Again, update messages are then generated for each of these bit nodes responsive to the soft decision, extrinsic bit estimates for these bit nodes.

Since all the bit nodes are connected to the check nodes in the first group, collectively, the processing of the first group 408a results in check node to bit node messages for each of the bit nodes. Before the second group 408b is processed, the hard decision, total bit estimates are updated in response to the update messages generated through the processing of the first group. Once these hard decision, total bit estimates have been updated, the second group is then processed. Since the processing of the second group is performed responsive to updated hard decision, total bit estimates that reflect the update messages resulting from the group one processing, the method converge faster than with the conventional method, which would have processed the second group responsive to bit estimates that did not reflect the processing of the first group.

As discussed, the check nodes are processed by generating update messages responsive to soft decision, extrinsic bit estimates for the connected bit nodes, which may vary depending with the check node that is the destination of the estimate. A soft decision, extrinsic estimate reflects messages originating from other check nodes in the group in a previous iteration, but excludes any message to the bit node generated through processing of the check node in question in the previous iteration.

Figure 5:
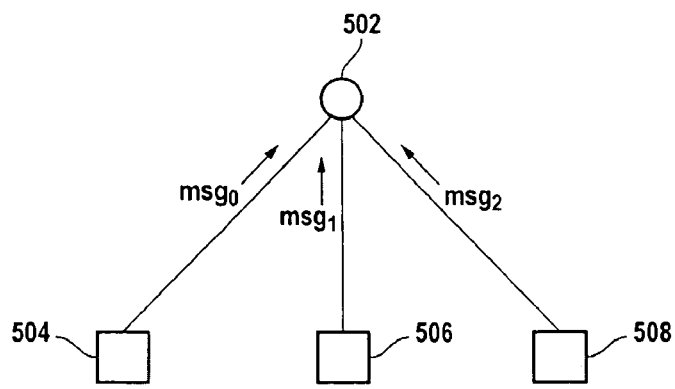
FIG. 5 shows the process of updating a bit node connected to several check nodes, providing context for an explanation in the specification of extrinsic message generation.

Thus, referring to FIG. 5, showing bit node 502, connected check nodes 504, 506, and 508, all of which are in the same group, and check node to bit node messages $msg_0$, $msg_1$ and $msg_2$, generated in the previous iteration, the soft decision, extrinsic bit estimate for check node 504 for use in the current iteration is the initial estimate at the start of the received frame decoding, $\lambda_{initial}$, plus the sum of all the messages generated in the previous iteration, $\Sigma msg_i$, minus the message generated by that bit node in the previous iteration, $msg_0$. In contrast, the soft decision, extrinsic bit estimate for check node 506 for use in the current iteration is the initial estimate at the start of the received frame decoding, $\lambda_{initial}$, plus the sum of all the messages generated in the previous iteration, $\Sigma msg_i$, minus the message generated by that bit node in the previous iteration, $msg_1$. Finally, the soft decision, extrinsic bit estimate for check node 508 for use in the current iteration is the initial estimate at the start of the received frame decoding, $\lambda_{initial}$, plus the sum of all the messages generated in the previous iteration, $\Sigma msg_i$, minus the message generated by that bit node in the previous iteration, $msg_2$.

Figure 6:
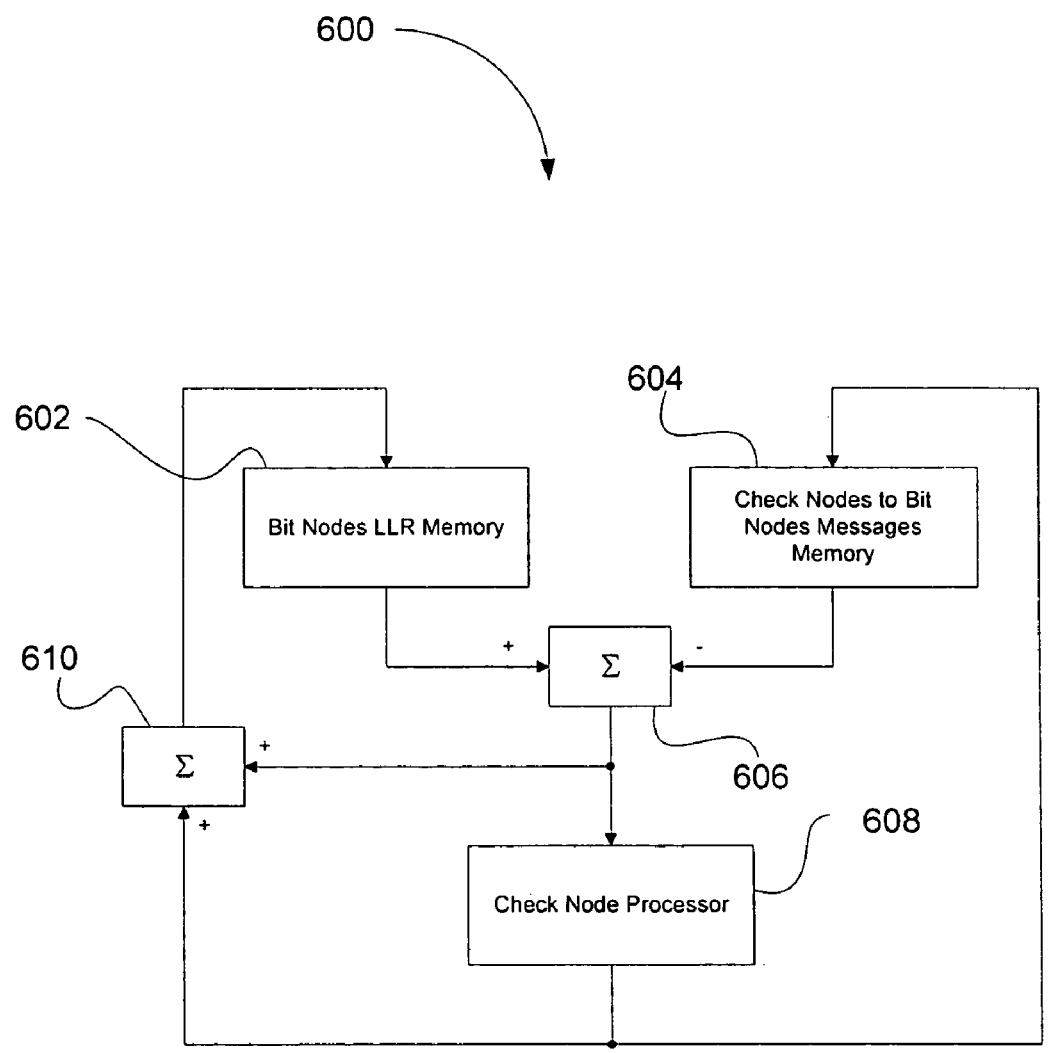
FIG. 6 is an implantation of a hybrid LDPC decoder configured to perform the method of FIG. 3, characterized by a "Bit Nodes LLR Memory" for holding LLR soft estimates for each of the bit nodes, a "Check Nodes to Bit Nodes Messages Memory" for holding check nodes to bit nodes messages generated in the course of check nodes processing, and a Check Node Processor for processing a group of check nodes in parallel.

FIG. 6 illustrates an efficient decoder implementation of the foregoing method that uses Log-Likelihood-Ratios (LLRs) for the initial estimations of the bit nodes. These LLRs are stored in a "Bit nodes LLR memory" 602 and updated through each iteration of the method. A "Check Nodes to Bit Nodes Messages Memory" 604 is used for storing the check nodes to bit nodes messages generated in an iteration.

In each iteration, the implementation performs the following steps for each of the check nodes groups:

1. For each connection between a bit node and a member of the group, reading an LLR for a bit node terminating the connection from the "Bit nodes LLR memory" 602, and producing an extrinsic estimate by using Subtractor 606 to subtract the message from the previous iteration associated with that connection as obtained from the "Check Nodes to Bit Nodes Messages Memory" 604.

2. Responsive to the extrinsic estimates, process in parallel the group of check nodes in the "Check Node Processor" 608, which may be implemented with multiple processors configured for parallel operation, thereby generating new check nodes to bit nodes messages.

3. For each connection between a bit node and a group member, reading an LLR for the bit node terminating the connection, using Subtractor 606 to subtract the message from the previous iteration associated with that connection as obtained from the "Check Nodes to Bit Nodes Messages Memory" 604, using Adder 610 to add the new message for that connection as generated in the current iteration, and storing the resulting value back in the "Bit nodes LLR memory" 602.

4. Updating the "Check Nodes to Bit Nodes Messages Memory" 604 with the new check node to bit nodes messages as computed in the "Check Node Processor" 608.

Figure 7:
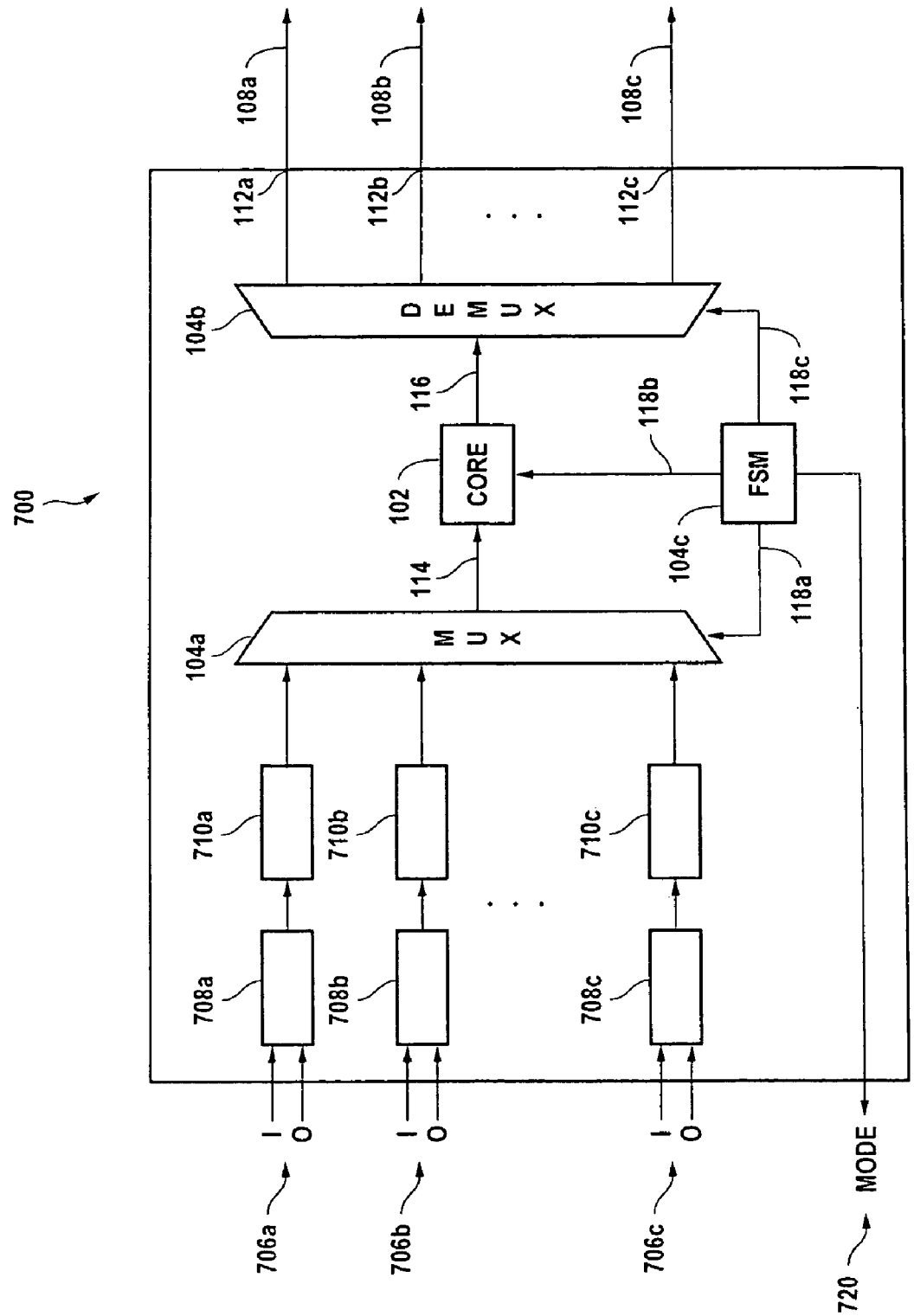
FIG. 7 illustrates an embodiment of the multi-channel decoder of FIG. 1, where the decoder core is configurable into a plurality of modes responsive to a mode signal.

FIG. 7(b) illustrates a second embodiment of a multi-channel decoder system in which, compared to the embodiment of FIG. 2, like elements are referenced with like reference numerals. For these like elements, with one or two exceptions, noted below, the previous description from FIG. 2 is still applicable, and need not be repeated. Instead, the discussion here focuses on additional features.

Figure 8A:
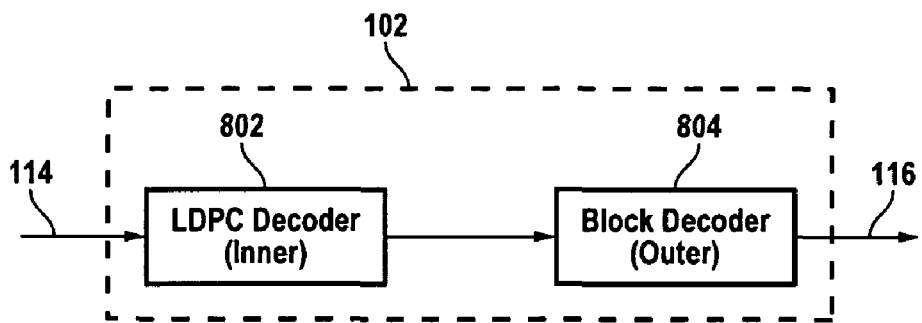
FIG. 8(*a*) is a block diagram of a decoder core configured as a concatenated decoder having an inner decoder and an outer decoder, with a LDPC decoder forming the inner decoder and a block decoder forming the outer decoder.
Figure 8B:
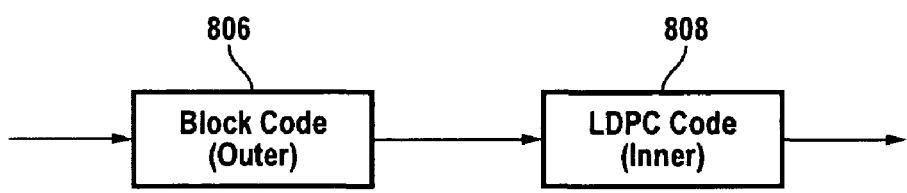
Figures 9, 10:
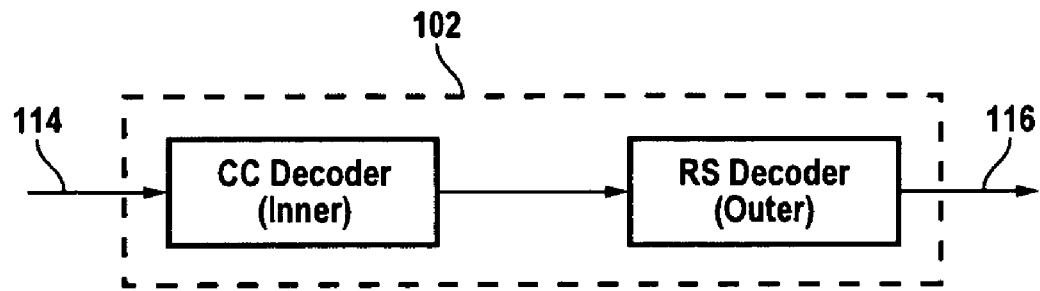
FIG. 9 is a block diagram of a decoder core configured as a concatenated decoder having an inner decoder and an outer decoder, with a Convolutional Code decoder forming the inner decoder and a Reed-Solomon decoder forming the outer decoder.
FIG. 10 is a table illustrating possible modes of a particular embodiment of a configurable decoder core.

In this embodiment, the decoder core 102 is configurable into a plurality of modes responsive to a mode signal 120. In one mode, the decoder core 102 is configured as a concatenated decoder, illustrated in FIG. 8(a), having an inner decoder 802 and an outer decoder 804. In one particular example, the inner decoder 802 is an LDPC decoder, and the outer decoder 804 is a block decoder, such as a Bose, Chaudhuri and Hocquenghem (BCH) decoder. In this mode, the decoder core 102 is capable of decoding data coded in accordance with the concatenated coding structure illustrated in FIG. 8(b), in which an outer block encoder 806 is followed by an inner LDPC encoder 808. In a second mode, as illustrated in FIG. 9, the decoder core 102 is configured as a concatenated decoder, with a Convolutional Code (CC) decoder, for example, a Viterbi decoder, capable of decoding convolutional encoded data forming the inner decoder of the concatenated structure, and a Reed-Solomon (RS) decoder capable of decoding RS-encoded data forming the outer decoder of the concatenated structure. In this particular example, the system is configured such that, in the first mode, a single LDPC/BCH decoder core is shared amongst the multiple channels, as shown in FIG. 2, while, in the second mode, a separate CC/RS decoder is provided to each of the multiple channels. Other examples are possible, so nothing in the foregoing description should be taken as limiting.

Referring back to FIG. 7, in this embodiment, each of the inputs 706a, 706b, 706c to the system 700 is assumed to be an analog, baseband signal in quadrature form, having an in-phase (I) component and an orthogonal (Q) component, representing symbols from a known symbol constellation. A dual A/D converter 708a, 708b, 708c coupled to each of the inputs converts each of the quadrature input signals to digital form. A demodulator 710a, 710b, 710c, also coupled to each of the signal paths, demodulates each of these signals into underlying bits in accordance with the known symbol constellation. Each of the demodulators is advantageously configurable to demodulate signals using any of a plurality of different symbol constellations, for example, QPSK and 8-PSK, thus allowing the symbols received over the channels to be encoded using different symbol constellations or symbol constellations that change over time within a particular channel. In one implementation, to allow for maximum flexibility, the demodulators are independently configurable responsive to separate mode signals. In another implementation, where maximum flexibility is not needed, the demodulators are configurable together in response to a common mode signal.

FIG. 10 is a table illustrating possible modes in accordance with an implementation in which a common mode signal is used to configure both the demodulators and decoder core 102 together. As shown, in this particular example, two modes are possible, modes 1 and 2. In mode 1, the decoder core 102 is configured as a concatenated decoder, with an LDPC decoder forming the inner decoder of the concatenated decoder, and a BCH decoder forming the outer decoder of the concatenated decoder. Also, in mode 1, each of the demodulators is configured either as an 8-PSK or QPSK demodulator. In mode 2, the decoder core 102 is configured a concatenated decoder, with a CC decoder, for example, a Viterbi decoder, forming the inner decoder of the concatenated decoder, and a RS decoder forming the outer decoder of the concatenated decoder. Also, in mode 2, each of the demodulators is configured as a QPSK demodulator. Thus, in this implementation, in mode 1, a single LDPC/BCH decoder core supports a plurality of DVB-S2 demodulators; and in mode 2, a single CC/RS decoder supports a plurality of DVB-S demodulators.

In one example, the system of FIG. 10 is implemented on a single integrated circuit chip.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A multi-channel decoder system comprising:
a decoder core at least a portion of which comprises as a Low Density Parity Check (LDPC) decoder that, during iterative decoding processing, divides check nodes of a node representation of a LDPC code into a plurality of groups, and, during an iteration, sequentially processes the groups while processing in parallel the check nodes within each group;
a plurality of independent channels for sharing the decoder core by carrying data to and from the decoder core, each channel configured for carrying data from a decoder input to the decoder core, and for carrying, after at least some decoding thereof by the decoder core, the resultant decoded data from the decoder core to an output of the decoder; and
control logic for controlling application of the decoder core to data carried by the channels.

2. The multi-channel decoder system of claim 1 wherein data is received by each of the channels in a particular order, and the control logic is configured to apply the decoder core to the data carried by each of the channels in the order in which the data is received.

3. The multi-channel decoder system of claim 1 wherein the plurality of channels are physically realized as a plurality of parallel signal paths, each coupled to a separate input of the decoder system.

4. The multi-channel decoder of claim 3 wherein each of the plurality of parallel signals paths is coupled to a separate output of the decoder system.

5. The multi-channel decoder system of claim 1 wherein the at least a portion of the decoder core comprises or in configurable as a hybrid LDPC.

6. The multi-channel decoder system of claim 1 wherein the decoder core comprises or is configurable as a concatenated decoder having an inner decoder and an outer decoder, with an LDPC decoder forming the inner decoder.

7. The multi-channel decoder system of claim 1 implemented on a single integrated circuit chip.

8. The multi-channel decoder system of claim 1, where the at least a portion of the decoder core is configurable as a Low Density Parity Check (LDPC) decoder that divides check nodes of a node representation of a LDPC code into groups, and iteratively processes the groups while processing in parallel the check nodes in a group.

9. A multi-channel decoder system comprising:
a decoder core configurable into any of a plurality of possible modes responsive to a mode signal, wherein, in one of the modes, at least a portion of the decoder core is configurable as a LDPC decoder that, during iterative decoding processing, divides check nodes of a node representation of a LDPC code into a plurality of groups, and, during an iteration, sequentially processes the groups while processing in parallel the check nodes within each group;

a plurality of independent channels for sharing the decoder core by carrying data to and from the decoder core, each channel configured for carrying data from a decoder input to the decoder core, and for carrying, after at least some decoding thereof by the decoder core, the resultant decoded data from the decoder core to an output of the decoder; and control logic for controlling application of the decoder core to data carried by the channels.

10. The system of claim 9 wherein, in one mode, the decoder core forms a concatenated decoder having an inner decoder and an outer decoder, with an LDPC decoder forming the inner decoder, and a block decoder forming the outer decoder.

11. The system of claim 10 wherein, in the one mode, a Bose, Chaudhuri and Hocquenghem (BCH) decoder forms the outer decoder.

12. The system of claim 9 wherein, in a second mode, the decoder core forms a concatenated decoder having an inner decoder and an outer decoder, neither of which is configured as an LDPC decoder.

13. The system of claim 12 wherein, in the second mode, a Convolutional Code (CC) decoder forms the inner decoder.

14. The system of claim 13 wherein the CC decoder is a Viterbi decoder.

15. The system of claim 12 wherein, in the second mode, a RS decoder forms the outer decoder.

16. The system of claim 9 wherein the plurality of channels are physically realized as a plurality of parallel signal paths, each coupled to a separate input of the system.

17. The system of claim 16 wherein each of the plurality of parallel signal paths is coupled to a separate output of the system.

18. The system of claim 9 further comprising a demodulator coupled to each of the inputs of the system.

19. The system of claim 18 wherein each of the demodulators are independent.

20. The system of claim 18 wherein one or more of the demodulators is configurable in responsive to mode signal.

21. The system of claim 9 implemented on a single integrated circuit chip.

* * * * *